(12) United States Patent
Lin et al.

(10) Patent No.: US 10,083,739 B2
(45) Date of Patent: Sep. 25, 2018

(54) THREE-DIMENSIONAL THREE-PORT BIT CELL AND METHOD OF ASSEMBLING SAME

(71) Applicant: Taiwan Semiconductor Manufacturing Co., Ltd., Hsin-Chu (TW)

(72) Inventors: Tzu-Kuei Lin, Chu-Pai (TW); Hung-Jen Liao, Hsin-Chu (TW); Yen-Huei Chen, Jhudong Township (TW); Ching-Wei Wu, Caotun Town (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/334,935

(22) Filed: Jul. 18, 2014

(65) Prior Publication Data
US 2016/0019946 A1 Jan. 21, 2016
US 2016/0276019 A9 Sep. 22, 2016

Related U.S. Application Data

(63) Continuation-in-part of application No. 14/098,567, filed on Dec. 6, 2013, now Pat. No. 9,208,854.

(51) Int. Cl.
*G11C 11/00* (2006.01)
*G11C 11/419* (2006.01)
(Continued)

(52) U.S. Cl.
CPC ............ *G11C 11/419* (2013.01); *G11C 5/025* (2013.01); *G11C 5/063* (2013.01); *G11C 7/1075* (2013.01); *G11C 8/16* (2013.01); *G11C 11/412* (2013.01); *G11C 11/413* (2013.01); *G11C 11/418* (2013.01); *H01L 21/768* (2013.01); *H01L 23/5226* (2013.01); *H01L 25/0657* (2013.01); *H01L 25/50* (2013.01); *H01L 27/0688* (2013.01); *H01L 27/11* (2013.01); *H01L 27/1104* (2013.01); *G11C 7/1096* (2013.01);
(Continued)

(58) Field of Classification Search
USPC ........................................................ 365/154
See application file for complete search history.

(56) References Cited

U.S. PATENT DOCUMENTS 6,747,890 B1 * 6/2004 Kirihata ................ H01L 27/108
257/E21.646
7,525,868 B2 4/2009 Liaw
(Continued)

OTHER PUBLICATIONS

Official Action dated Mar. 15, 2016 in counterpart Korean patent application No. 10-2014-0174223.
(Continued)

*Primary Examiner* — Anthan Tran
(74) *Attorney, Agent, or Firm* — Duane Morris LLP

(57) ABSTRACT

A three-port, three-dimensional bit cell generally comprises a read portion of a cell disposed on a first tier. The read portion comprises a plurality of read port elements. The three-port bit cell further comprises a write portion of the cell disposed on a second tier that is vertically stacked with respect to the first tier. The first and second tiers are coupled using at least one via. The write portion comprises a plurality of write port elements.

18 Claims, 11 Drawing Sheets

(51) Int. Cl.
*G11C 11/413* (2006.01)
*H01L 27/11* (2006.01)
*G11C 7/10* (2006.01)
*H01L 25/065* (2006.01)
*G11C 8/16* (2006.01)
*G11C 11/412* (2006.01)
*H01L 27/06* (2006.01)
*G11C 5/02* (2006.01)
*G11C 5/06* (2006.01)
*H01L 21/768* (2006.01)
*H01L 23/522* (2006.01)
*H01L 25/00* (2006.01)
*G11C 11/418* (2006.01)
*G11C 11/40* (2006.01)

(52) U.S. Cl.
CPC ..... *G11C 11/40* (2013.01); *H01L 2225/06541* (2013.01); *H01L 2924/0002* (2013.01)

(56) References Cited

U.S. PATENT DOCUMENTS 8,189,368 B2 * 5/2012 Liaw ................... G11C 11/412
365/154

| | | | |
|---|---|---|---|
| 2007/0115710 A1 | 5/2007 | Kim et al. | |
| 2008/0123462 A1 | 5/2008 | Liaw | |
| 2008/0165562 A1 | 7/2008 | Matick et al. | |
| 2008/0283995 A1 | 11/2008 | Bucki et al. | |
| 2008/0291767 A1* | 11/2008 | Barnes ............... H01L 21/8221 365/230.05 | |
| 2009/0303820 A1* | 12/2009 | Arsovski ............... G11C 11/419 365/203 | |
| 2011/0267914 A1 | 11/2011 | Ishikura et al. | |
| 2015/0063040 A1 | 3/2015 | Chan et al. | |
| 2015/0085556 A1 | 3/2015 | Chan et al. | |
| 2015/0085567 A1 | 3/2015 | Wang et al. | |

OTHER PUBLICATIONS

Official Action dated Jun. 1, 2017 in corresponding Chinese Patent Application No. 201410745285.1.

Official Action dated Aug. 17, 2017 in corresponding Korean Patent Application No. 10-2016-0174994.

* cited by examiner

THREE-DIMENSIONAL THREE-PORT BIT CELL AND METHOD OF ASSEMBLING SAME

CROSS-REFERENCE TO RELATED APPLICATIONS

This application is a continuation-in-part of pending U.S. patent application Ser. No. 14/098,567, filed on Dec. 6, 2013, and entitled "THREE DIMENSIONAL DUAL-PORT BIT CELL AND METHOD OF ASSEMBLING SAME," which is herein incorporated by reference in its entirety.

FIELD OF DISCLOSURE

The disclosed systems and methods relate to static random access memory ("SRAM") arrays and, more particularly, to a three-port bit cell that can be used with SRAM arrays.

BACKGROUND

Static random access memories ("SRAMs") or semiconductor memories include a plurality of cells disposed in rows and columns to form an array. SRAM cells include a plurality of transistors coupled to bit lines and word lines that are used to read and write a bit of data to the memory cell. Single-port SRAMs enable a single bit of data to be written to or read from a bit cell at a particular time. In contrast, a multi-port SRAM enables multiple reads or writes to occur at approximately the same time. Conventional multi-port SRAM structures include word lines ("WLs") in different metal lines, which causes different capacitive loading due to the different metal length being used to route signals of the SRAM. Multi-port SRAM structures are larger and wider in the WL direction than a single-port SRAM structure. Due to the larger and wider WL direction for the multi-port SRAM, the aspect ratio of an SRAM array can be impacted during heavy WL loading, especially for wide input/output ("I/O") designs. When compared with a single-port SRAM, the periphery logic circuitry of the multi-port SRAM is doubled. As such, multi-port SRAMs can occupy a larger area, and signal routing complexities can occur.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
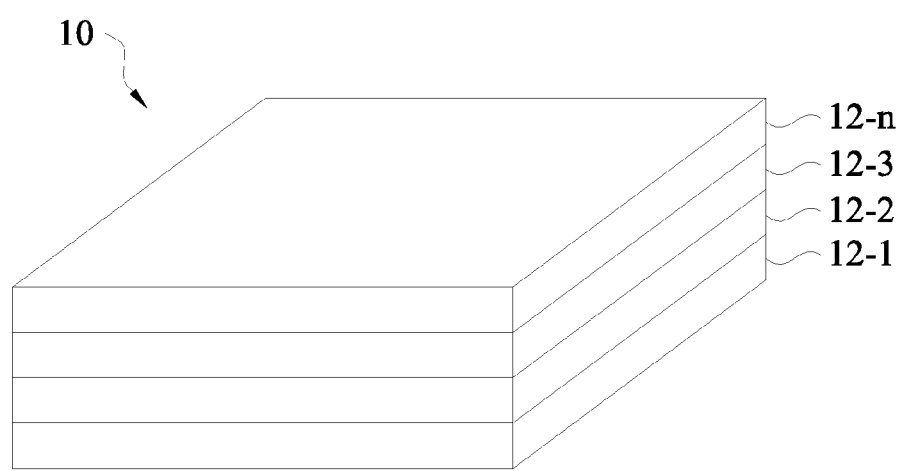
FIG. 1 is a perspective view of one example of a three-dimensional semiconductor integrated circuit in accordance with some embodiments.
Figure 1:
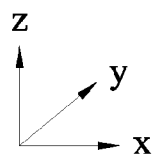

This description of the exemplary embodiments is intended to be read in connection with the accompanying drawings, which are to be considered part of the entire written description.

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the three-dimensional bit cells described herein have a configuration and design that facilitates a reduction in footprint area, while improving overall cell performance and inhibiting signal routing complexities for the corresponding semiconductor memory or static random access memory ("SRAM") array in which the cell is used. For example, in some embodiments, the three-dimensional bit cell is configured such that one set of port elements of a portion of a latch are disposed on one layer of a three-dimensional ("3D") semiconductor integrated circuit ("IC") and another set of port elements of another portion of the latch are disposed on a different layer of the IC that is vertically adjacent to the other layer. Having the two different sets of port elements on separate layers of the IC facilitates a footprint area reduction, and word line ("WL") parasitic resistance and capacitance is also reduced. Therefore, the overall performance of the cell is substantially improved.

FIG. 1 illustrates one example of a 3D semiconductor IC 10. 3D IC 10 includes a plurality of layers 12-1, 12-2, 12-3, 12-n ("layers 12") that are vertically stacked on top of one another in the z-direction. In some embodiments, layers 12 are individual dies that are electrically coupled to one another with at least one through-substrate via ("TSV"), or inter-layer via ("ILV") or inter-device via ("ILD") (not shown in FIG. 1). It should be noted that, as used herein, the term "couple" is not limited to a direct mechanical, thermal, communication, and/or an electrical connection between components, but may also include an indirect mechanical, thermal, communication and/or electrical connection between multiple components.

In some embodiments, each layer 12 of 3D IC 10 is a respective "tier" where each tier includes a respective active device layer and a respective interconnect structure, which can include a plurality of conductive layers (e.g., M1, M2, etc.). Interlayer dielectric ("ILD") layers (not shown) can be disposed between directly adjacent tiers as will be understood by one of ordinary skill in the art.

Figure 2:
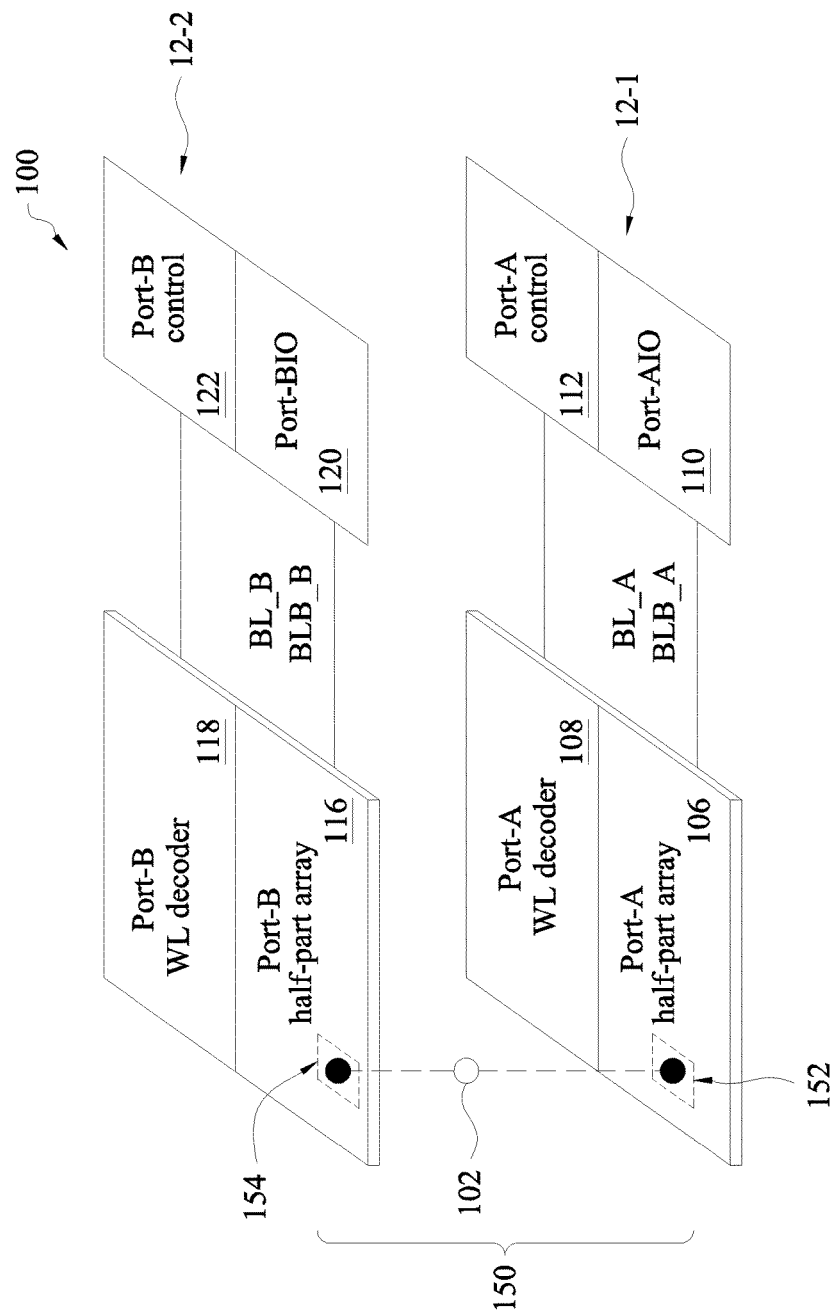
FIG. 2 is an electrical diagram of one example of a three-dimensional static random access memory (SRAM) array that is used with the three-dimensional semiconductor integrated circuit shown in FIG. 1 in accordance with some embodiments.

FIG. 2 illustrates one example of a semiconductor memory or SRAM array 100. In some embodiments, the SRAM array 100 is included in 3D IC 10 (shown in FIG. 1). For example, SRAM array 100 can be disposed across two layers or tiers, such as bottom layer 12-1 and upper layer 12-2, that are arranged vertically with respect to one another and coupled together by, for example, one or more ILVs 102 (only one being shown in FIG. 2).

In some embodiments, bottom layer 12-1 includes one port, such as an A-port, and upper layer 12-2 includes another port, such as a B-port. As such, in some embodiments, the input/output ("I/O") circuitry for the A-port and the B-port are disposed on two separate conductive layers. For example, in some embodiments, bottom layer 12-1 includes A-port elements, such as an A-port array portion 106 and an A-port world line ("WL") decoder and driver portion 108. In some embodiments, A-port array portion 106 is coupled to an A-port I/O circuit 110 with complementary bit lines ("BLs") therebetween, such as BL_A and its complement BLB_A. In some embodiments, A-port I/O circuit 110 is configured to receive data input signals and to transmit data output signals out of SRAM 100.

As used herein, the term "circuit" refers generally to any programmable system including systems and microcontrollers, reduced instruction set circuits ("RISC"), application specific integrated circuits ("ASIC"), programmable logic circuits ("PLC"), and any other circuit capable of executing the functions described herein. The above examples are exemplary only, and thus are not intended to limit in any way the definition and/or meaning of the term "circuit."

In some embodiments, A-port WL decoder and driver portion 108 is coupled to an A-port control circuit 112. A-port control circuit 112 can be configured to receive a clock signal of the A-port and a write enable signal (negative enable). A-port control circuit 112 can also be configured to receive address signals.

Top layer 12-2 includes a B-port array portion 116 and a B-port WL decoder and driver portion 118. In some embodiments, B-port array portion 116 is coupled to a B-port I/O circuit 120 with complementary BLs therebetween, such as BL_B and its complement BLB_B. In some embodiments, B-port I/O circuit 120 is configured to receive data input signals and to transmit data output signals out of array 100. In some embodiments, B-port WL decoder and driver portion 118 is coupled to a B-port control circuit 122 that can be configured to receive a clock signal of the B-port and a write enable signal (negative enable). B-port control circuit 122 can also be configured to receive address signals.

SRAM array 100 includes at least one three-dimension dual-port bit cell 150 that includes a first portion 152 that is disposed on a first layer, e.g., bottom layer 12-1. For example, first portion 152 is disposed on at least a portion of A-port array portion 106. Dual-port bit cell 150 also includes a second portion 154 that is disposed on a second layer that is disposed vertically relative to the first layer, e.g., upper layer 12-2 of SRAM array 100. For example, second portion 154 is included in at least a portion of B-port array portion 116. As will be explained in more detail below with respect to FIGS. 3 and 4, dual-port bit cell 150 has a configuration and design that facilitates a reduction in footprint area while improving overall cell performance and inhibiting signal routing complexities for SRAM array 100.

In some embodiments, A-port array portion 106 and A-port WL decoder and driver portion 108 are disposed on bottom layer 12-1 such that A-port array portion 106 and A-port WL decoder and driver portion 108 are each symmetric with B-port array portion 116 and B-port WL decoder and driver portion 118, respectively. Similarly A-port I/O circuit 110 and A-port control circuit 112 are disposed on bottom layer 12-1 such that A-port I/O circuit 110 and A-port control circuit 112 are each symmetric with B-port I/O circuit 120 and B-port control circuit 122, respectively.

Figure 3:
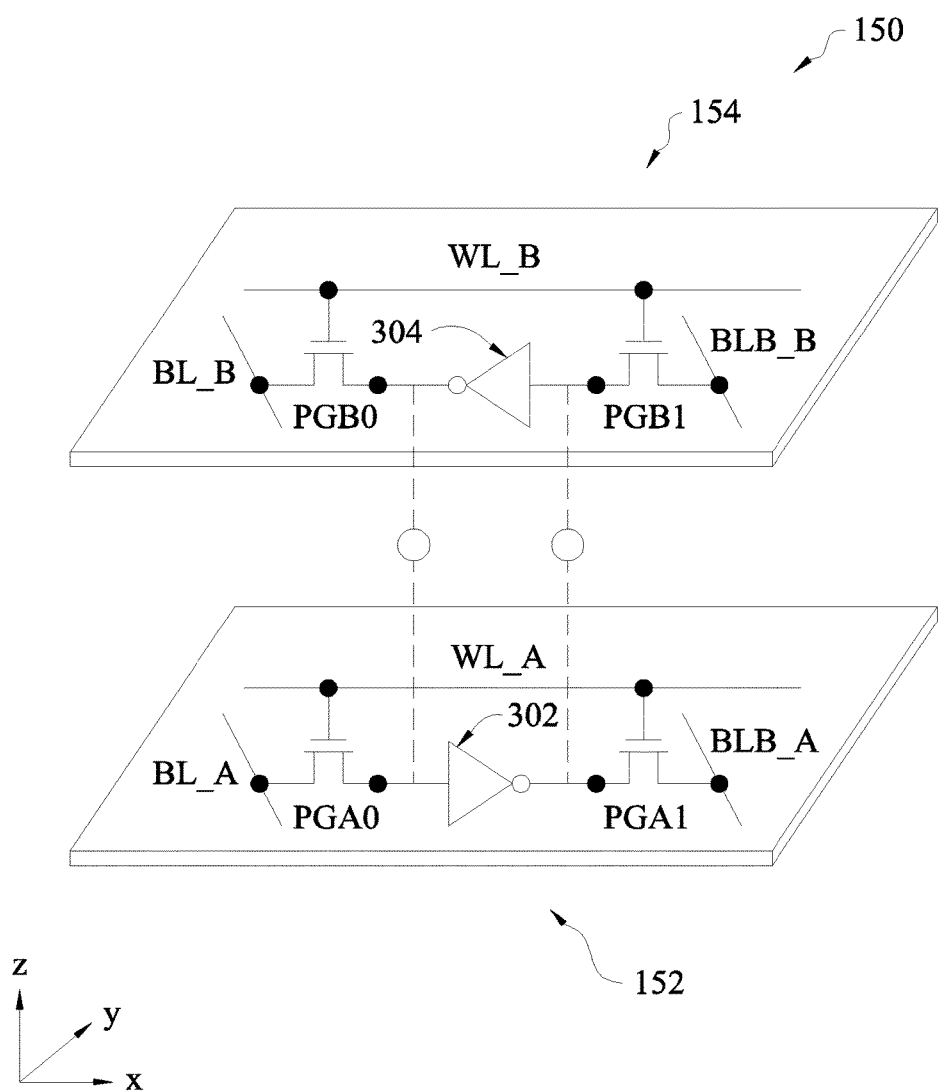
FIG. 3 is an electrical diagram of one example of a three-dimensional dual-port bit cell that is used with the SRAM array shown in FIG. 2 in accordance with some embodiments.
Figure 4:
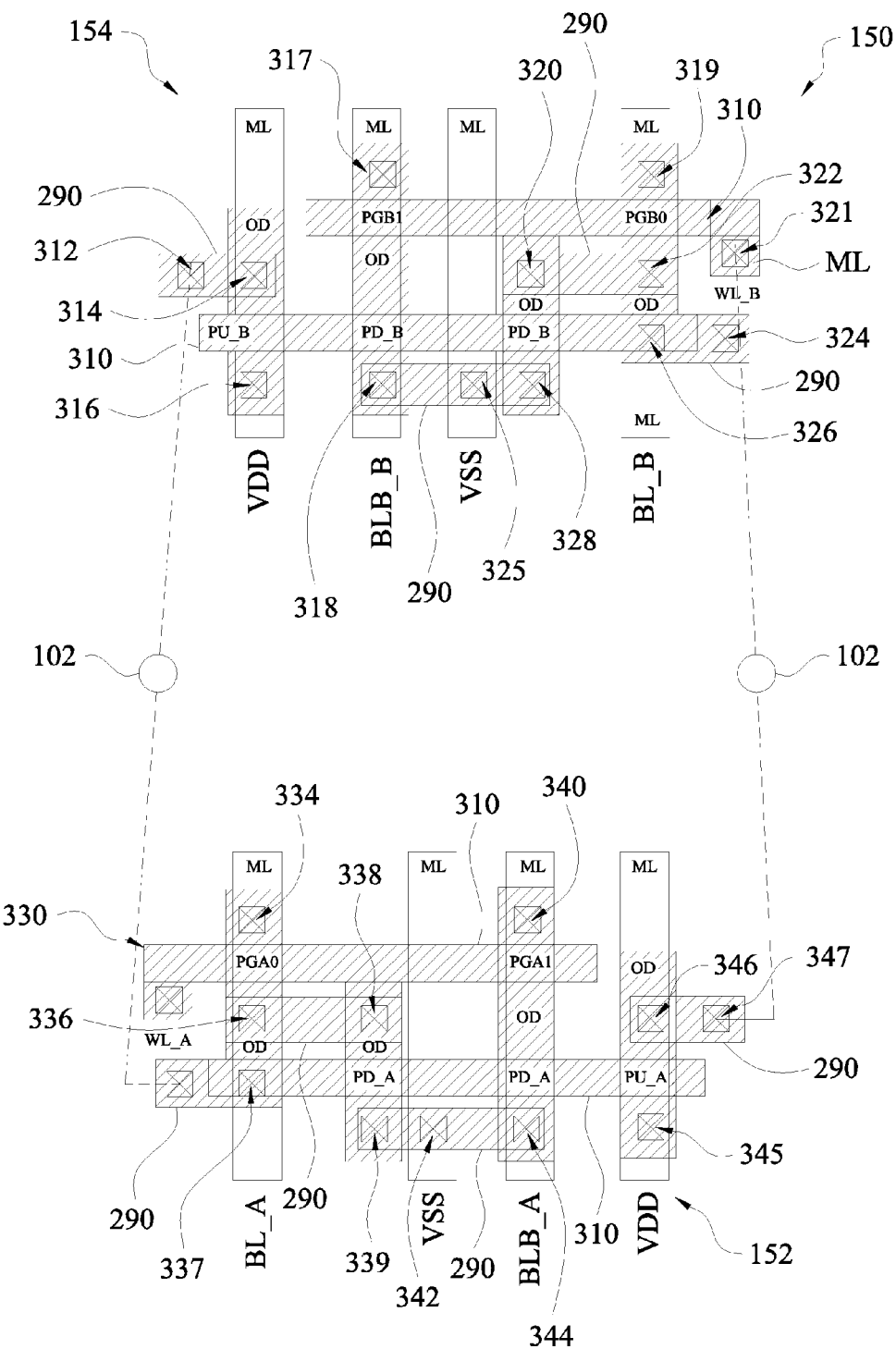
FIG. 4 is a block diagram of the three-dimensional dual-port bit cell shown in FIG. 3.

FIG. 3 is an electrical diagram of one example of dual-port bit cell 150 in accordance with some embodiments. FIG. 4 is a layout diagram of dual-port bit cell 150. Referring to FIG. 3, in some embodiments, dual-port bit cell 150 is a high density dual-port bit cell and, as discussed above, first portion 152 of cell 150 is disposed on a first layer of SRAM array 100 (FIG. 2), e.g., bottom layer 12-1 (shown in FIGS. 1 and 2). For example, first portion 152 is disposed on at least a portion of A-port array portion 106 (shown in FIG. 2). Therefore, first portion 152 includes the A-port elements. Second portion 154 of bit cell 150 is disposed on a second layer of SRAM array 100 (FIG. 2), e.g., upper layer 12-2 (shown in FIGS. 1 and 2), that is disposed vertically with respect to the first layer. For example, second portion 154 is disposed on at least a portion of B-array portion 116 (shown in FIG. 2) and, therefore, second portion 154 includes the B-port elements.

Referring to FIGS. 3 and 4, in some embodiments, each portion 152 and 154 includes a plurality of conductive lines or layers (e.g., M1, M2, M3, etc.) ("ML") having BLs and WLs disposed therein such that the BLs extend in a first direction in at least one conductive layer (e.g., M1, M2, M3) of each of the upper and lower layers or tiers 12-2 (shown in FIGS. 1 and 2) and 12-1 (shown in FIGS. 1 and 2), and the word lines WLs extend in a second direction in at least one second conductive layer (e.g., M1, M2, M3) of the upper and lower layers or tiers 12, wherein the first direction is different from the second direction. For example, first portion 152 includes at least one WL, such as WL_A that extends horizontally (i.e., in an x-direction) across bottom layer 12-1 (shown in FIGS. 1 and 2). First portion 152 also includes at least one pair of complementary BLs that extend vertically (i.e., in a y-direction) across bottom layer 12-1. For example, first portion 152 can include at least one pair of complementary BLs, such as BL_A and BLB_A also shown in FIGS. 3 and 4. As shown in FIG. 4, bit lines BL_A and BLB_A extend parallel to one another with a power line (e.g., VSS) disposed between them and extending parallel to bit lines BL_A and BLB_A. A second power line (e.g., VDD) is also disposed in the same conductive layer (e.g., M1, M2, M3) as bit lines BL_A and BLB_A and VSS. The line for VDD is disposed adjacent to BLB_A and extends parallel to bit lines BL_A and BLB_A and VSS. In some embodiments, first portion 152 also includes A-port elements that include at least two pass-gate (PG) transistor devices, such as PGA0 and PGA1, that are coupled to the WLs and to the BLs. In some embodiments, PG transistor devices are NMOS or PMOS devices. In some embodiments, additional interconnect structures 290 are used to connect the active devices of the first portion 152 and the active devices (e.g., transistors) in the second portion 154.

In some embodiments, first portion 152 also includes at least one inverter 302, wherein each inverter 302 can include at least one pull-up (PU) transistor device, such as PU_A (FIG. 4) and at least one pull-down (PD) transistor devices, such as PD_A (FIG. 4). In some embodiments, the PU transistor devices and the PD transistor devices are NMOS or PMOS devices. First portion 152 can have any number of PG, PU, and PD transistor devices.

Similar to first portion 152, second portion 154 also includes at least one WL, such as WL_B that extends horizontally (i.e., in an x-direction) across upper layer 12-2. Second portion 154 also includes at least one pair of complementary BLs that extend vertically (i.e., in a y-direction) across upper layer 12-2. For example, second portion 154 can include at least one pair of complementary BLs, such as BL_B and BLB_B. In some embodiments, second portion 154 also includes B-port elements that include at least two PG transistor devices, such as PGB0 and PGB1, that are coupled to the WLs and to the BLs. In some embodiments, PG transistor devices are NMOS or PMOS devices.

In some embodiments, second portion 154 also includes at least one inverter 304, wherein inverter 304 can include at least one PU transistor device, such as PU_B and least one PD transistor devices, such as PD_B. In some embodiments, the PU transistor devices and the PD transistor devices are NMOS or PMOS devices. Second portion 154 can have any number of PG, PU, and PD transistor devices.

As shown in FIG. 4, each of the transistor devices, PGA0, PGA1, PD_A, PU_A, PGB0, PGB1, PD_B, and PU_B include gates 310 that may include a polysilicon ("poly")/silicon oxynitride ("SiON") structure, a high-k/metal gate structure, or combinations thereof. Examples of the semiconductor substrate include, but are not limited to, bulk silicon, silicon-phosphorus ("SiP"), silicon-germanium ("SiGe"), silicon-carbide ("SiC"), germanium ("Ge"), silicon-on-insulator silicon ("SOI-Si"), silicon-on-insulator germanium ("SOI-Ge"), or combinations thereof. In some embodiments, gates 310 can be formed over one or more active regions ("OD") of a semiconductor substrate using various technologies. For example, gates 310 can be formed as bulk planar metal oxide field effect transistors ("MOSFETs"), bulk finFETs having one or more fins or fingers, semiconductor on insulator ("SOI") planar MOSFETs, SOI finFETs having one or more fins or fingers, or combinations thereof.

In some embodiments, the PGA0, PGA1, PD_A, and PU_A transistor devices are disposed on bottom layer 12-1 such that the PGA0, PGA1, PD_A, and PU_A transistor devices are symmetric with the PGB0, PGB1, PD_B, and PU_B transistor devices, respectively. For example, in some embodiments, ports, such as A-port and B-port (shown in FIG. 2), are substantially parallel with respect to each other such that the PGA0 and PGA1 transistor devices are parallel with respect to the PD_A and PU_A transistor devices on the same layer 12-1. Similarly, the PGB0 and PGB1 transistor devices are parallel with respect to the PD_A and PU_A transistor devices on the same layer 12-2.

In some embodiments, various vias are used to facilitate connections within each layer 12-1 and 12-2 or between the layers 12-1 and 12-2. For example, as shown in FIG. 4, in some embodiments, one ILV 102 is used to connect a via 312 in layer 12-1 to a via 336 in layer 12-2. Similarly, the other ILV 102 is used to connect a via 324 in layer 12-1 to a via 347 in layer 12-2. Vias 314 and 316 connect the PU_B transistor device transistor PGA0 and to the power supply line VDD, respectively. Via 317 connects the PGB1 transistor device to the BLB_B. Vias 318, 325, and 328 connect the PD_B transistor devices to the power supply line VSS. Vias 320 and 322 and interconnect 290 connect the PGB0 transistor device to the PD_B transistor devices. Via 319 connects the PGB0 transistor device to the BL_B, and via 326 and interconnect 290 connect the PGB0 transistor device to via 324. Via 321 connects the PGB0 transistor device to the WL_B.

In some embodiments, via 330 connects the PGA0 transistor device to the WL_A. Via 334 connects the PGA0 transistor device to the BL_A. Via 337 and interconnect 290 connect the PD_A transistor device and PGA0 to the ILV 102. Vias 336 and 338 and interconnect 290 connect the PGA0 transistor device to the PD_A transistor devices. Vias 339, 342, and 344 and interconnect 290 connect the PD_A transistor devices to the power supply line VSS. Via 340 connects the PGA1 transistor device to BLB_A. Vias 346 and 347 and interconnect 290 connect the PU_A transistor device to ILV 290. Via 345 connects transistor PU_A to the power supply line VDD.

When using the described configurations for dual-port bit cell 150, one set of port elements, such as the A-port, are disposed on bottom layer 12-1 of SRAM array 100 and the other set of port elements, such as the B-port, are disposed on upper layer 12-2 of SRAM array 100. Such a design and configuration facilitates a cell footprint reduction and a total cell area reduction. Because the configurations for dual-port bit cell 150 have the two sets of port elements on separate layers, WL parasitic resistance and capacitance is reduced. As such, the overall performance of the dual-port bit cell 150 is substantially improved. Also, by having the two sets of port elements on separate layers, power routing and signal routing for each of the A-port and B-port is separated between the two layers. For example, in some embodiments, the power supply for the A-port can be routed within bottom layer 12-1 for the PU_A or the PD_A transistor devices and a first set of signals (WL_A, BL_A, and BLB_A) for the A-port can be routed within bottom layer 12-1 for the PGA0 and PGA1 transistor devices. Similarly, the power supply for the B-port can be routed within upper layer 12-2 for the PU_B or the PD_B transistor devices and a second set of signals (WL_B, BL_B, and BLB_B) for the A-port can be routed within upper layer 12-2 for the PGB0 and PGB1 transistor devices.

Figure 5:
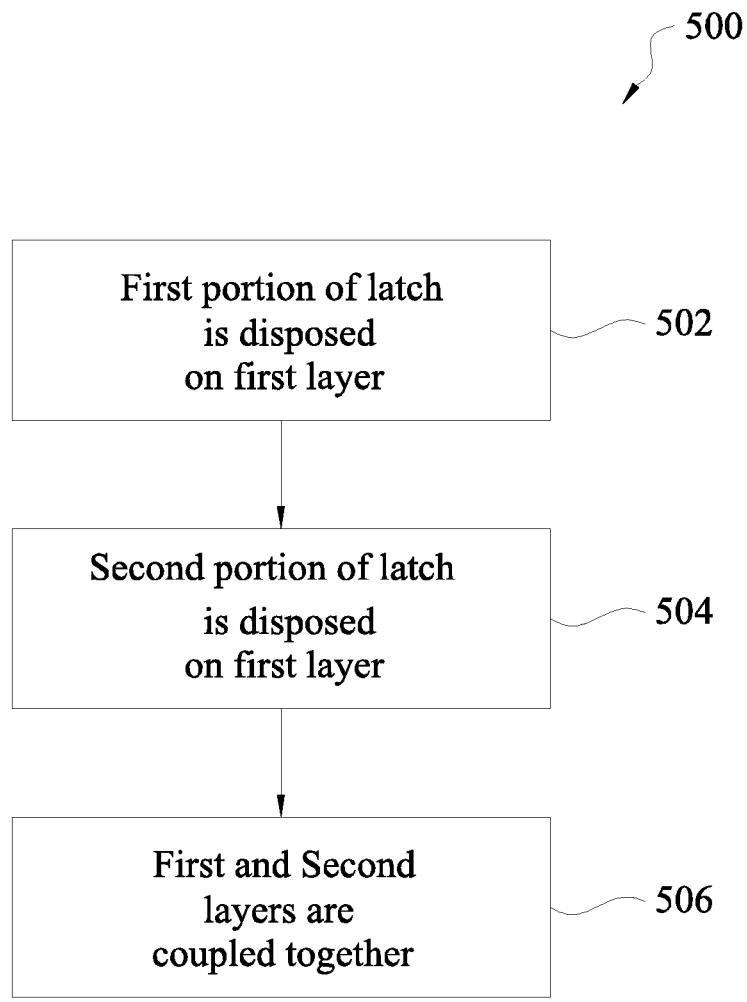
FIG. 5 is a flow diagram of one example of a method of assembling the three-dimensional dual-port bit cell shown in FIG. 3.

FIG. 5 is a flow diagram of one example of a method 500 of assembling a three-dimensional dual-port bit cell, such as cell 150 (shown in FIGS. 2, 3, and 4), to be used with a semiconductor memory or SRAM array, such as SRAM array 100 (shown in FIG. 2). At step 502, a first portion of a latch is disposed onto a first layer. For example, first portion 152 (shown in FIGS. 2, 3, and 4) is disposed on at least a portion of A-port array portion 106 (shown in FIG. 2) on bottom layer 12-1 (shown in FIGS. 1 and 2) of 3D IC 10 (shown in FIG. 1). In some embodiments, the active devices of the first portion 152 are formed in a semiconductor substrate (not shown) using a semiconductor processing technology. A-port WL decoder and driver portion 108 (shown in FIG. 2), A-port I/O circuit 110 (shown in FIG. 2), and A-port control circuit 112 (shown in FIG. 2) are also formed in and on bottom layer 12-1.

At step 504, a second portion of the latch is disposed onto a second layer that is adjacent to the first layer. For example, second portion 154 (shown in FIGS. 2, 3, and 4) is disposed on at least a portion of B-array portion 116 (shown in FIG. 2) on upper layer 12-2 (shown in FIGS. 1 and 2) 3D IC 10. B-port WL decoder and driver portion 118 (shown in FIG. 2), B-port I/O circuit 120 (shown in FIG. 2), and B-port control circuit 122 (shown in FIG. 2) are also formed in and on upper layer 12-2.

At step 506, the first and second layers are coupled together such that the second layer is vertically stacked with respect to the first layer using at least one via. For example, if layers 12-1 and 12-2 are separate semiconductor chips, then layers 12-1 and 12-1 are vertically stacked on top of one another, aligned, and bonded together. In some embodiments, such as embodiments in which layers 12-1 and 12-2 are tiers, the layers are stacked on top of one another to create a 3D stacked complementary metal-oxide-semiconductor CMOS IC. One of ordinary skill in the art will understand that one or more layers can be disposed between layers 12-1 and 12-2 in some embodiments. In some embodiments, the circuitry formed in and/or on layer 12-1 is coupled to the circuitry formed in and/or on layer 12-2 using at least one via, such as ILV 102 (shown in FIGS. 2, 3, and 4). For example, in some embodiments, as shown in FIG. 4, one ILV 102 is used to connect via 312 in the layer 12-1 to via 336 in layer 12-2. Similarly, as shown in FIG. 4, the other ILV 102 is used to connect via 324 in layer 12-1 to via 347 in layer 12-2. Further, as shown in FIG. 4, various vias are used to facilitate connections within each layer 12-1 and 12-2.

Figure 6:
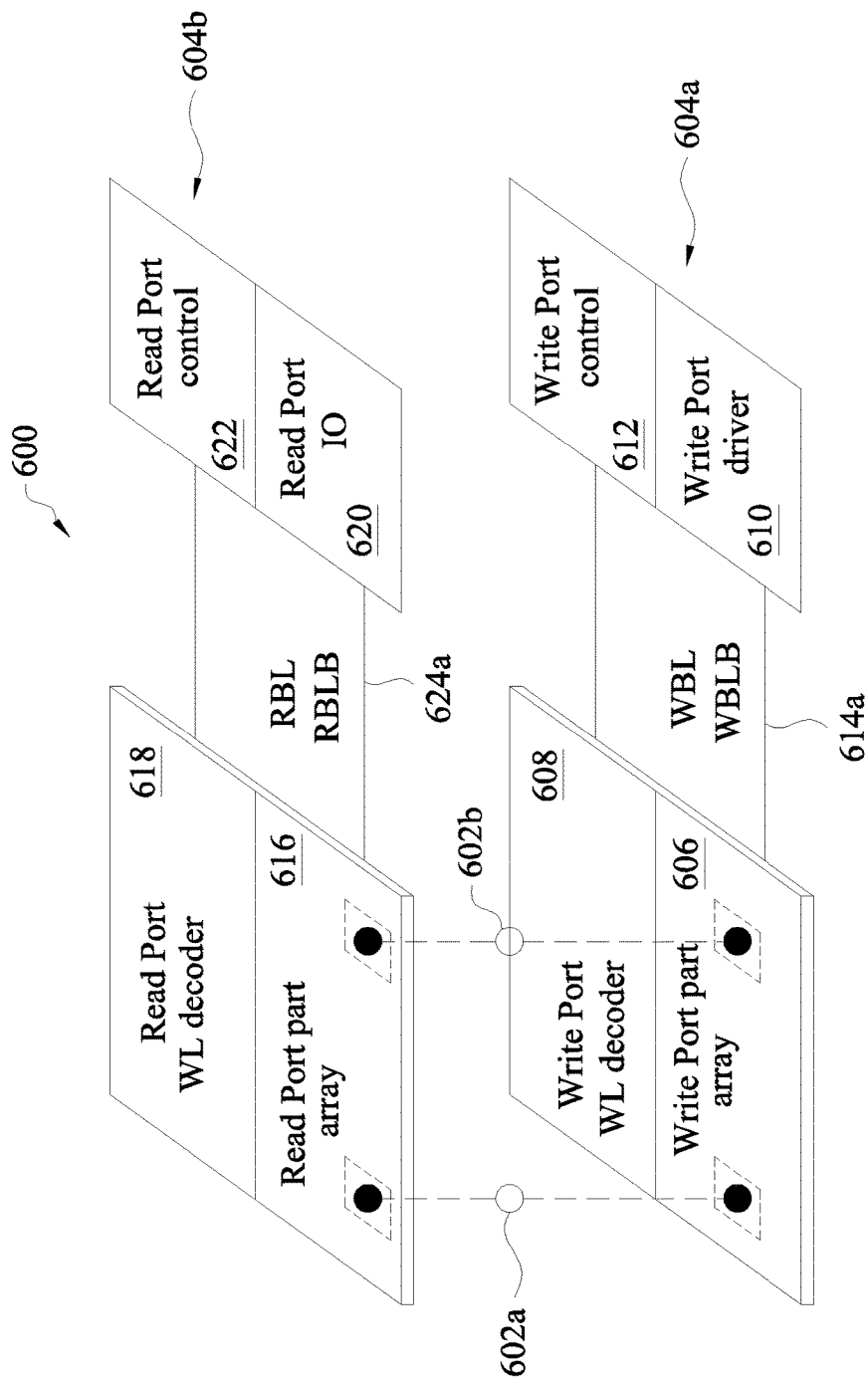
FIG. 6 is an electrical diagram of one example of a three-dimensional SRAM array that is used with the three-dimensional semiconductor integrated circuit shown in FIG. 1 in accordance with some embodiments.

FIG. 6 illustrates one example of a semiconductor memory or SRAM array 600. In some embodiments, the SRAM array 600 is included in the 3D IC 10 (shown in FIG. 1). For example, SRAM array 600 can be disposed across two (or more) layers or tiers, such as, for example, a bottom layer 12-1 and an upper layer 12-2 (illustrated in FIG. 1), that are arranged vertically with respect to one another and coupled together by, for example, one or more ILVs 602a, 602b.

In some embodiments, the SRAM array 600 comprises a write layer 604a and a read layer 604b. The write layer 604a comprises write port elements, such as, for example, a write port array portion 606 and a write port word line decoder 608. In some embodiments, the write port array portion 606 is coupled to a write port driver 610 by complementary bit lines 614, such as, for example, WBL and its complement WBLB. In some embodiments, the write port driver 610 is configured to receive input signals for the SRAM 600. A write port control circuit 612 can be coupled to the write port word line decoder 608. The write port control circuit 612 is configured to receive a clock signal of the write port and a write enable signal (for example, a negative enable signal). The write port control circuit 612 can also be configured to receive address signals.

In some embodiments, the SRAM 600 comprises a read layer 604b. The read layer 604b comprises read port elements, such as, for example, a read port array portion 616 and a read port word line decoder and driver 618. In some embodiments, the read port array portion 616 is coupled to a read port I/O circuit 620 by complementary bit lines 624, such as, for example, RBL and its complement RBLB. In some embodiments, the read port I/O circuit 620 is configured to receive data input signals and/or to transmit data output signals out of the SRAM array 600. In some embodiments, the read port word line decoder 608 is coupled to a read port control circuit 622. The read port control circuit 622 can be configured to receive a clock signal of the read port and a read enable signal. The read port control circuit 622 can also be configured to receive address signals.

Figure 7:
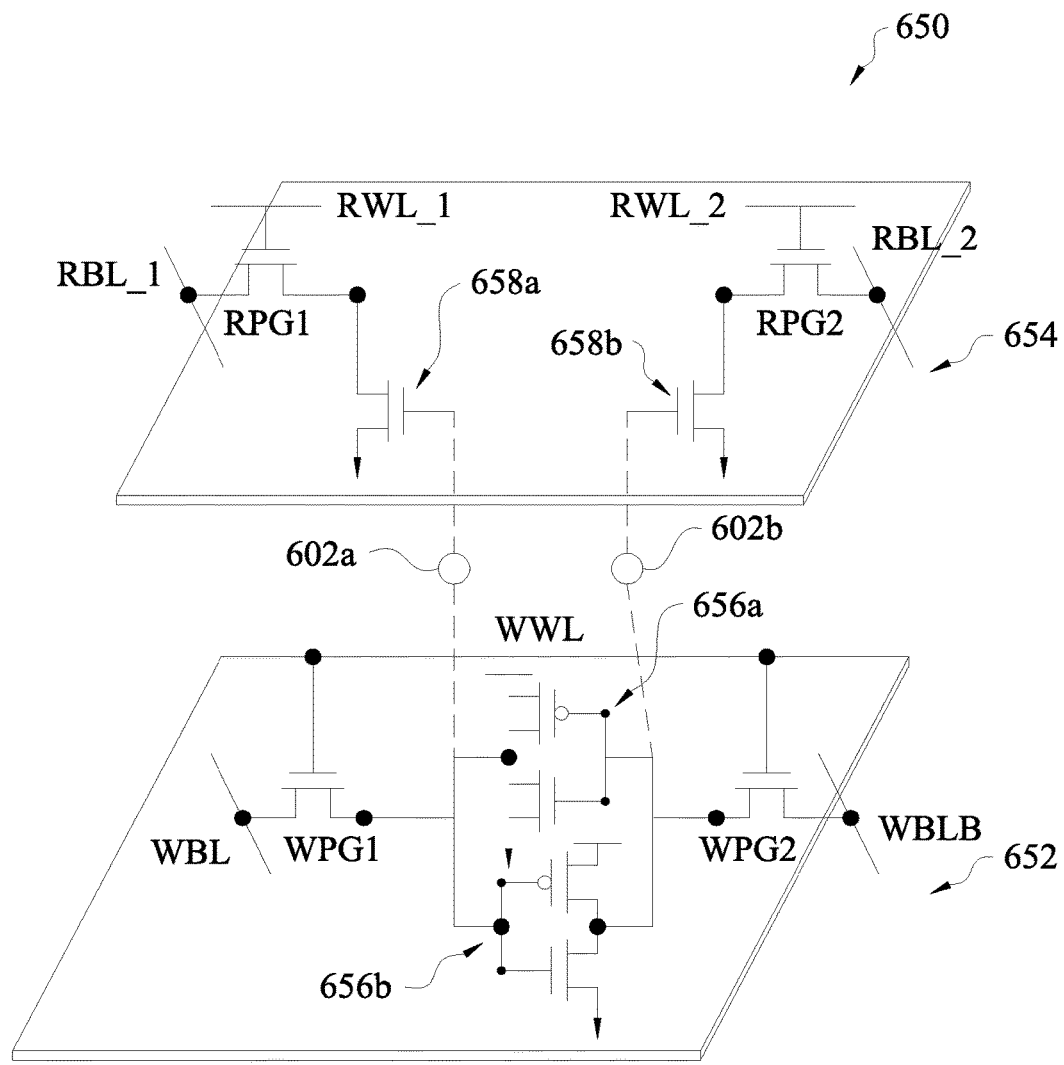
FIG. 7 is an electrical diagram of one example of a three-dimensional, three-port bit cell comprising NMOS pass-gate structures that is used with the SRAM array shown in FIG. 6 in accordance with some embodiments.

The SRAM array 600 includes at least one three-dimensional, three-port bit cell 650 comprising a first portion 652 disposed on a first layer, such as, for example, the write port array portion 606, and a second portion 654 disposed on a second layer, such as, for example, the read port array portion 616 (see FIG. 7). As will be explained in more detail below, the three-port bit cell 650 has a configuration and design that facilitates a smaller cell footprint, a higher speed, and an adjustable and flexible WL decoder layout that is simple and routing-friendly.

In some embodiments, the write port array portion 606 and the write port WL decoder 608 are disposed on a write layer 604a such that the write port array portion 606 and the write port WL decoder 608 are symmetric with the read port array portion 616 and the read port WL decoder and driver portion 618, respectively. Similarly, the write port driver 610 and the write port control 612 can be symmetric with the read port I/O circuit 620 and the read port control 622, respectively.

Figure 8:
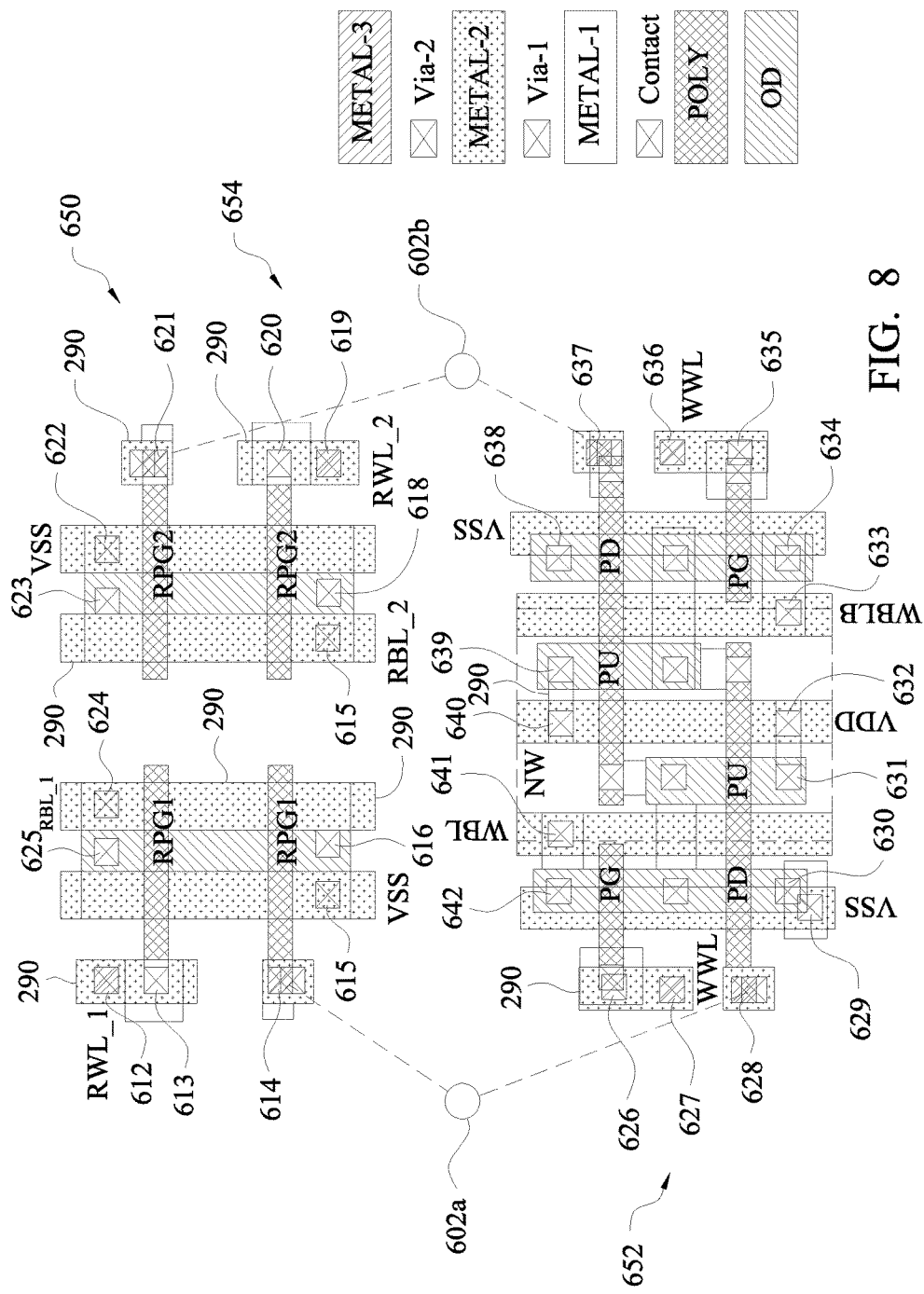
FIG. 8 is a block diagram of the three-dimensional, three-port bit cell shown in FIG. 7.

FIG. 7 is an electrical diagram of one example of a three-dimensional, three-port bit cell 650 in accordance with some embodiments. FIG. 8 is a layout diagram of the three-port bit cell 650. Referring to FIG. 7, in some embodiments, the three-port bit cell 650 comprises a high density three-port cell comprising a write portion 652 and a read portion 654. The write portion 652 of the three-port bit cell 650 is disposed on at least a portion of a first layer of the SRAM array 600, such as, for example, the write layer 604a. The read portion 654 of the three-port bit cell 650 is disposed on at least a portion of a second layer of the SRAM array 600, such as, for example, the read layer 604b.

In some embodiments, each portion 652, 654 of the three-port bit cell 650 comprises a plurality of conductive lines or layers having bit lines (BLs) and word lines (WLs) disposed therein such that the bit lines extend in a first direction in at least one conductive layer and the word lines extend in a second direction in at least a second conductive layer, wherein the first direction is different from the second direction. For example, in the embodiment illustrated in FIG. 7, the write portion 652 comprises a set of complementary bit-lines, WBL and WBLB. The bit lines are disposed in a first conductive layer of the write portion 652. The write portion 652 further comprises a write word line, WWL. WWL is disposed in a second conductive layer of the write portion 652. WBL and WBLB extend in a first direction, such as, for example, a vertical direction and WWL extends in a second direction, such as, for example, a horizontal direction. The read portion 654 comprises a set of bit lines, RBL_1 and RBL_2, disposed in a first conductive layer of the read portion 654. The set of bit lines RBL_1 and RBL_2 can comprise complimentary bit lines RBL and RBLB. The read portion 654 further comprises at least one read word line disposed in a second conductive layer of the read portion 654. In the illustrated embodiment, the read portion 654 comprises a first read word line and a second read word line, RWL_1 and RWL_2, respectively. RBL_1 and RBL_2 extend in a first direction, such as, for example, a vertical direction and RWL_1 and RWL_2 extend in a second direction, such as, for example, a horizontal direction. In some embodiments, RWL_1 and RWL_2 may comprise a single read word line.

Figure 9:
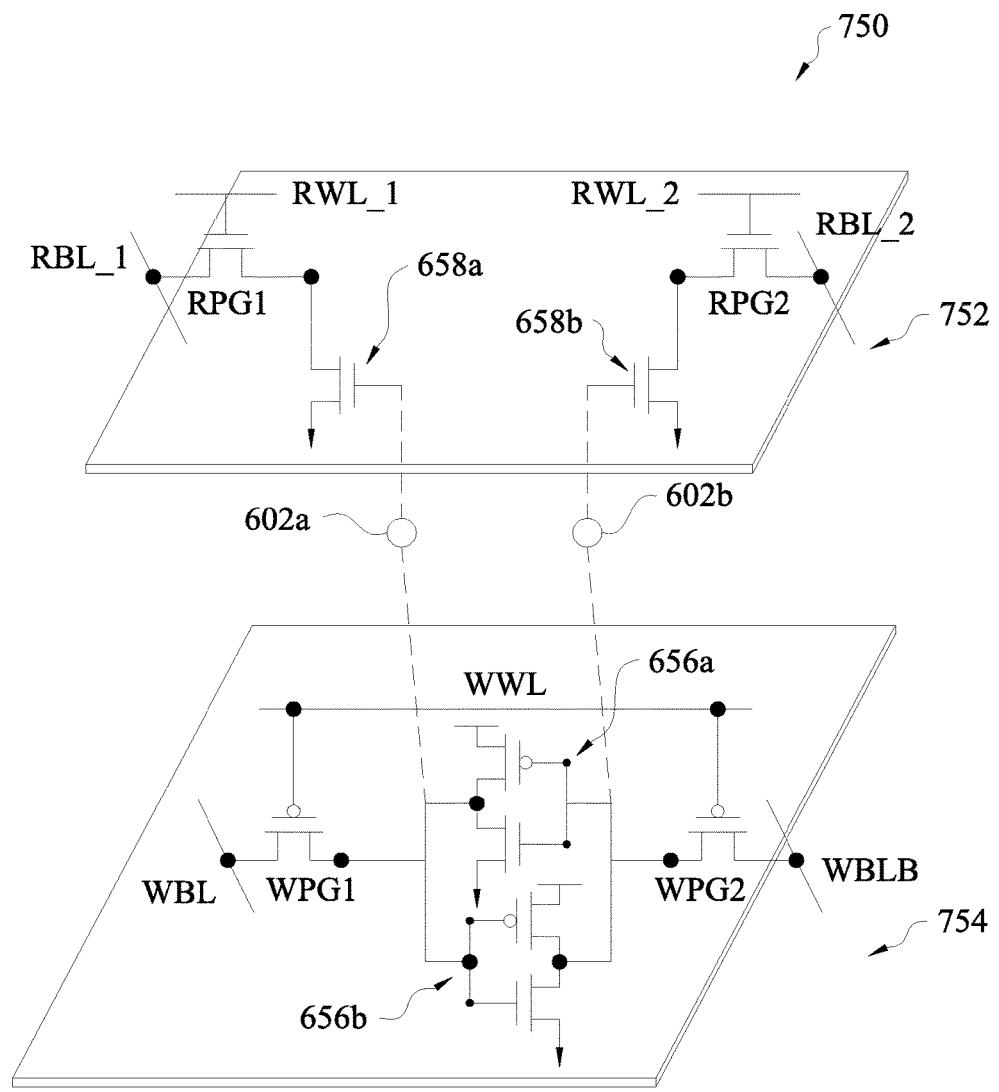
FIG. 9 is an electrical diagram of one example of a three-dimensional, three-port bit cell comprising PMOS pass-gate structures that is used with the SRAM array shown in FIG. 6 in accordance with some embodiments.
Figure 10:
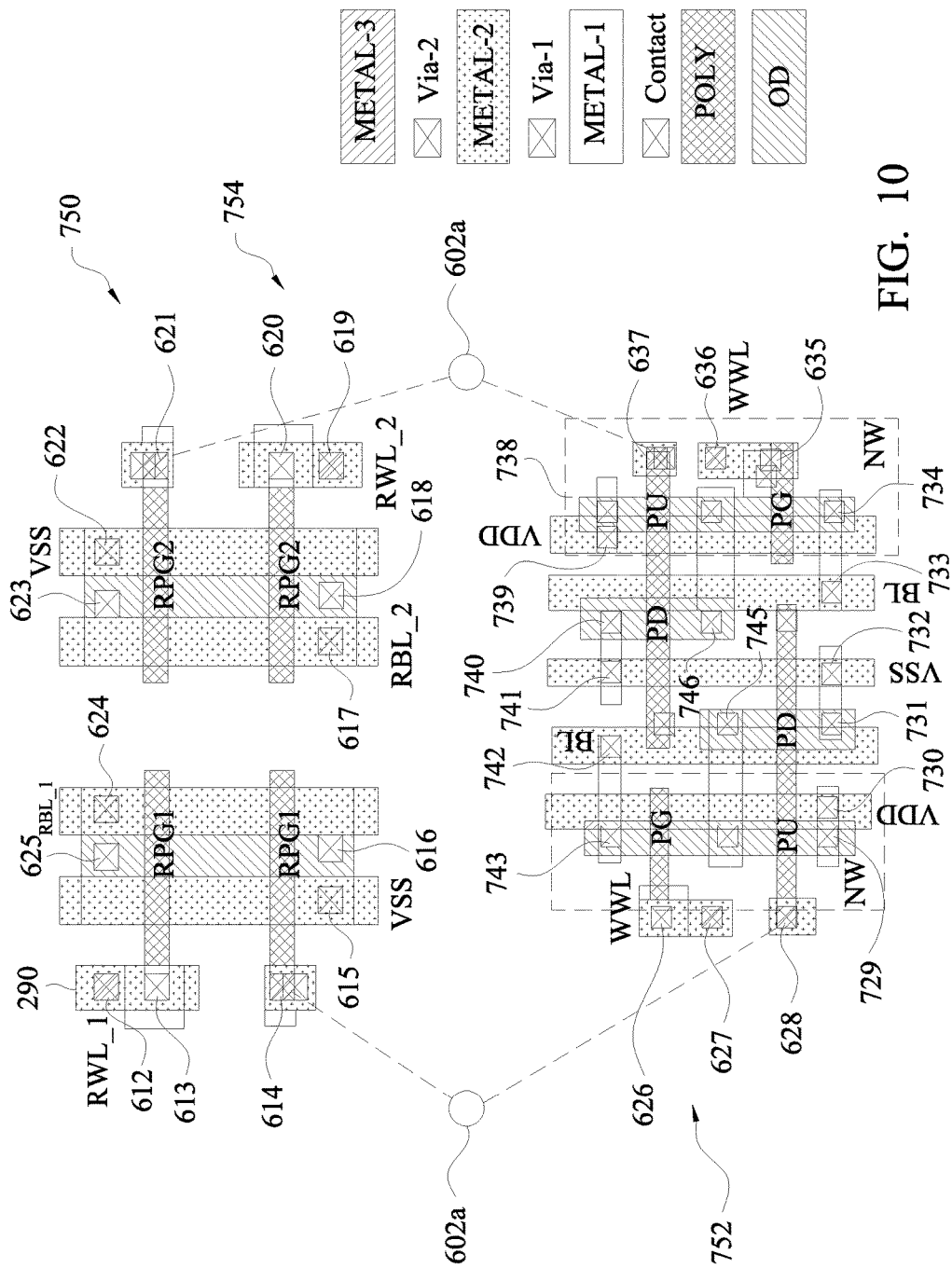
FIG. 10 is a block diagram of the three-dimensional, three-port bit cell shown in FIG. 9.

In some embodiments, the write portion 652 and/or the read portion 654 comprise a plurality of pass gate (PG) transistor devices such as, for example, WPG1 and WPG2 disposed in the write portion 652 and RPG1 and RPG2 disposed in the read portion 654. WPG1 and WPG2 are coupled to WBL and WBLB, respectively, and are both coupled to WWL. RPG1 is coupled to RBL_1 (or RBL) and RWL_1 and RPG2 is coupled to RBL_2 (or RBLB) and RWL_2. The PG transistor devices may comprise PMOS or NMOS transistor devices. For example, FIGS. 7 and 8 illustrate one embodiment of a bit cell 650 comprising NMOS pass-gate structures. As another example, FIGS. 9 and 10 illustrate one embodiment of a bit cell 750 wherein pass-gates WPG1 and WPG2 comprise PMOS pass-gate structures.

In some embodiments, the write portion 652 and/or the read portion 654 may comprise one or more additional transistor devices. For example, in some embodiments, the write portion 652 comprises a plurality of latches 656a, 656b. The plurality of latches 656a, 656b comprise a self-reinforcing arrangement. The plurality of latches 656a, 656b are coupled to WPG1 and WPG2 of the write layer 652. In some embodiments, the read portion 654 comprises a plurality of gates 658a, 658b coupled to RPG1 and RPG2. In some embodiments, the read layer 654 comprises a plurality of latch invertors (see FIG. 11).

As illustrated in FIG. 8, in some embodiments the plurality of latches 656a, 656b disposed on the write layer 652 comprise a plurality of pull-up (PU) transistor devices and pull-down (PD) transistor devices. In various embodiments, the PU transistor devices and the PD transistor devices comprise NMOS and/or PMOS devices. In the illustrated embodiment, each of the latches comprises a PU transistor device and a PD transistor device.

In some embodiments, a plurality of vias are formed to facilitate connections within each layer 652, 654 and between the write layer 652 and the read layer 654. One or more inter-layer vias (ILVs) allow connections between the write layer 652 and the read layer 654. For example, in one embodiment, a first ILV 602a is configured to electrically couple a via 628 in the write layer 652 to a via 614 in the read layer 654 and a second ILV 602b is configured to electrically couple a via 637 in the write layer 652 to a via 621 in the read layer 654. Vias 626 and 635 are configured to couple the PG transistor devices, such as, for example, WPG1 and WPG2, to WWL. Vias 631, 632, 639, and 640 couple a power supply, VDD, to the PU transistor devices of each of the latches 656a, 656b. Vias 629 and 638 couple a power supply, VSS, to the PD transistor devices of each of the latches 656a, 656b.

In some embodiments, the read layer 654 comprises a plurality of vias configured to facilitate connections within the read layer 654. Vias 612 and 613 couple RPG1 to RWL_1. Vias 619 and 620 couple RPG2 to RWL_2. Vias 615 and 622 couple a power supply, VSS, to pull down transistors 658a, 658b, shown as RPD1 and RPD2 respectively. Vias 624 and 625 couple RBL_1 to RPG1 and vias 617 and 618 couple RBL_2 to RPG2. Those skilled in the art will recognize that additional or fewer vias may be included in the write layer 652 and/or the read layer 654.

In some embodiments, the three-port bit cell 650 comprises a three-dimensional, three-port, ten transistor (3D 10T) bit cell. The 3D 10T bit cell is configured for use in an SRAM memory structure. The 3D 10T bit cell comprises a write portion 652 and a read portion 654 disposed on separate layers of an SRAM array 600, for example, a write port array portion 606 and a read port array portion 616, respectively. In some embodiments, the write portion 652 comprises a six transistor (6T) NMOS SRAM structure and the read portion 654 comprises a four transistor structure. In some embodiments, the write portion 652 comprises a 6T PMOS pass-gate (PPG) SRAM structure. The write portion 652 and the read portion 654 are coupled by a plurality of ILVs 602a, 602b. The 3D 10T bit cell facilitates a smaller footprint and eliminates wasted empty front-end area, resulting in a simple and routing friendly periphery for the 3D 10T bit cell.

In various embodiments, the three-port bit cell 650 can comprise three-port operation or two-port operation. In three-port operation, a first read port, RPG1, and a second read port, RPG2, are independent. For example, as shown in FIG. 7, RPG1 is coupled to a first read word line RWL_1 and RPG2 is coupled to a second read word line RWL_2. The read port operations of RPG1 and RPG2 may comprise single-ended reads while maintaining the value of the cell ("keeping in"). In two-port operation, RPG1 and RPG2 are connected, for example, by a single read word line (not shown). The two-port read port operation can comprise a voltage differential sense amplifier scheme.

The described configurations of three-port bit cells 650 facilitate a cell footprint reduction and a total cell area reduction. For example, in one embodiment, a 3D 10T bit cell as described above can provide an almost 50% reduction in macro area over a traditional 3D 10T bit cell. Further, because the three-port bit cells 650 have a write port 652 and a read port 654 disposed on separate layers, WL parasitic resistance and capacitance is reduced, resulting in an overall performance improvement of the three-port bit cell 650. By having the write port 652 and the read port 654 on separate layers, power routing and signal routing for each of the write port and the read port can be separated between the two layers, resulting in a simple and routing-friendly periphery.

FIGS. 9 and 10 illustrate one embodiment of a three-dimensional, three-port bit cell 750 wherein the write layer 752 comprises a first PMOS pass-gate structure, WPG1, and a second PMOS pass-gate structure, WPG2. The three-dimensional, three-port bit cell 750 is similar to the bit cell 650 described in conjunction with FIGS. 7 and 8. FIG. 10 illustrates a block diagram of the three-dimensional, three-port bit cell 750 illustrated in FIG. 9. The bit cell 750 comprises a plurality of vias to facilitate connections between and within each of the layers 752, 754. Vias 729, 730, 738, and 739 couple the PU transistor devices of the latches 656a, 656b to a power source, VDD. Vias 731, 732, 740, and 741 couple PD transistor devices of the latches 656a, 656b to a power source, VSS. The block diagram of FIG. 10 is similar to the block diagram illustrated in FIG. 8.

Figure 11:
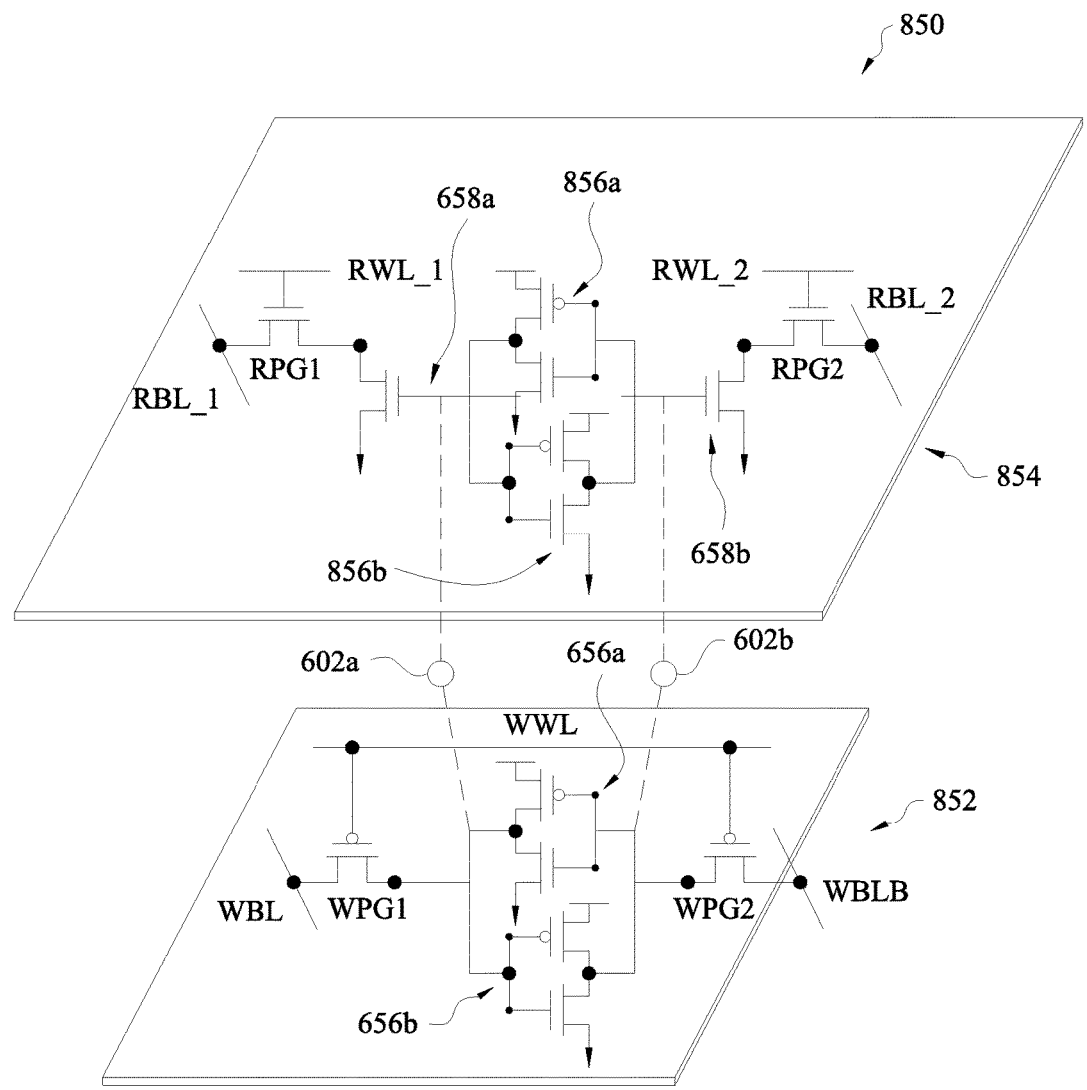
FIG. 11 is an electrical diagram of one example of a three-dimensional, three-port bit cell comprising a plurality of latch invertors disposed on a read portion.

FIG. 11 illustrates one embodiment of bit cell 850 comprising a plurality of latch invertors 856a and 856b disposed on a read portion 854. The plurality of latch invertors 856a, 856b may comprise a plurality of NMOS and/or PMOS devices. In some embodiments, the transistor devices WPG1, WPG2, and latches 656*a*, 656*b* are disposed on a write layer 852 such that they are symmetrically disposed with respect to the transistor devices RPG1, RPG2, and inverter latches 856*a*, 856*b* of the read portion 854.

Embodiments of the three dimensional dual-port bit cell described herein have a configuration and design that facilitates a reduction in footprint area while improving overall cell performance and inhibiting signal routing complexities for the corresponding static random access memory ("SRAM") array that the cell is used with. For example, in some embodiments, the 3D dual-port cell is configured such that one set of port elements of a portion of a latch are disposed on one layer of a 3D semi-conductor IC and another set of port elements of another portion of the latch are disposed on a different layer of the IC that is vertically adjacent to the other layer. Having the two different sets of port elements on separate layers of the IC facilitates a footprint area reduction, and WL parasitic resistance and capacitance is also reduced. Therefore, the overall performance of the cell is substantially improved.

In some embodiments, a three dimensional dual-port bit cell includes a first portion of a latch disposed on a first tier, wherein the first portion includes a plurality of first port elements. A second portion of the latch is disposed on a second tier that is vertically stacked with respect to the first tier using at least one via, wherein the second portion includes a plurality of second port elements.

In some embodiments, a semi-conductor memory includes a first tier that includes a first port array portion. The semi-conductor memory also includes a second tier that is vertically stacked with respect to the first tier using at least one via, wherein the second tier includes a second port array portion. The semi-conductor memory also includes at least one three dimensional dual-port bit cell that includes a first portion of a latch disposed on the first port array portion, wherein the first portion includes a plurality of first port elements. The dual-port bit cell also includes a second portion of the latch disposed on the second array portion, wherein the second portion includes a plurality of second port elements.

In some embodiments, a method of using a three dimensional dual-port bit cell includes disposing a first portion of a latch of the three-dimensional dual-port bit cell onto a first tier, wherein the first portion includes a plurality of first port elements. The method also includes disposing a second portion of the latch of the three-dimensional dual-port bit cell onto a second tier that is vertically stacked with respect to the first tier using at least one via, wherein the second portion includes a plurality of second port elements.

Embodiments of the three-dimensional three-port bit cell described herein have a configuration and design that facilitates a reduction in footprint area while improving overall cell performance and inhibiting signal routing complexities for the corresponding static random access memory ("SRAM") array that the cell is used with. For example, in some embodiments, the three-dimensional. three-port bit cell is configured such that a write set of port elements are disposed on a first layer of a 3D semiconductor IC and a read set of port elements are disposed on a second layer of the IC that is vertically adjacent to the first layer. Having the two different sets of port elements on separate layers of the IC facilitates a footprint area reduction, and WL parasitic resistance and capacitance is also reduced. Therefore, the overall performance of the cell is substantially improved.

In some embodiments, a three-dimensional, three-port bit cell includes a read portion disposed on a first tier. The read portion comprises a plurality of read port elements. The three-port bit cell further comprises a write portion disposed on a second tier that is vertically stacked with respect to the first tier. The first and second tiers are coupled using at least one via. The write portion comprises a plurality of write port elements.

In some embodiments, a semiconductor memory includes a first tier having a first port array portion. The semiconductor memory also includes a second tier vertically stacked with respect to the first tier. The first and second tiers are coupled using at least one via. The second tier comprises a second port array portion. The semiconductor memory also includes at least one three-dimensional, three-port bit cell. The three-dimensional, three-port bit cell includes a write portion disposed on the first port array portion of the first tier. The write portion comprises a plurality of write port elements. The three-dimensional, three-port bit cell also includes a read portion disposed on the second port array portion of the second tier. The read portion includes a plurality of read port elements In some embodiments, a method for forming a three-dimensional, three-port bit cell is disclosed. In a first step, a read portion of the three-dimensional, three-port bit cell is disposed on a first tier of a semiconductor structure. The read portion of the three-dimensional, three-port bit cell comprises a plurality of read port elements. In a second step, a write portion of the bit cell is disposed on a second tier of the semiconductor structure. The write portion comprises a plurality of write port elements. The first tier and the second tier are vertically stacked and are coupled by at least on via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A three-dimensional static random access memory (SRAM) array, comprising:
a write portion disposed on a first tier, wherein said write portion comprises a plurality of write port elements including a write port array portion, wherein said write portion further comprises a plurality of write bit lines that each extend in a first direction in a first conductive layer of the first tier and at least one write word line that extends in a second direction in a second conductive layer of the first tier, wherein the first conductive layer and the second conductive layer of the first tier are different; and
a read portion disposed on a second tier that is vertically stacked with respect to the first tier and coupled to the first tier using at least one via, wherein said read portion comprises a plurality of read port elements including a read port array portion, wherein said read portion further comprises a plurality of read bit lines that each extend in the first direction in a first conductive layer of the second tier and at least one read word line that extends in the second direction in a second conductive layer of the second tier, wherein the first conductive layer and the second conductive layer of the second tier are different; and at least one three-port bit cell comprising a first portion disposed on the write port array portion and a second portion disposed on the read port array portion, wherein the first portion comprises a first transistor and a first latch invertor, wherein the second portion comprises a second transistor and a second latch invertor, and wherein the first transistor is vertically symmetrically disposed with the second transistor and the first latch invertor is vertically symmetrically disposed with the second latch invertor, and wherein the first transistor is coupled to the second transistor by an inter-layer via.

2. The three-dimensional SRAM array of claim 1, wherein said second direction is different from the first direction.

3. The three-dimensional SRAM array of claim 1, wherein said plurality of read port elements comprises a plurality of read port gates.

4. The three-dimensional SRAM array of claim 3, wherein said read portion further comprises at least one latch invertor disposed on the second tier and coupled to the plurality of read port gates.

5. The three-dimensional SRAM array of claim 3, wherein said plurality of write port elements comprises a plurality of write port gates.

6. The three-dimensional SRAM array of claim 5, wherein the three-port bit cell comprises a ten transistor cell, wherein said read port elements comprise a four transistor structure and said write port elements comprise a six transistor structure.

7. The three-dimensional SRAM array of claim 5, wherein each of said plurality of read port gates and said plurality of write port gates is one of a NMOS device or a PMOS device.

8. The three-dimensional SRAM array of claim 1, further comprising:
   a write control circuit disposed on the first tier; and
   a read control circuit disposed on the second tier.

9. The three-dimensional SRAM array of claim 8, wherein the read control circuit comprises a read port control circuit and a read word line decoder, and wherein the write control circuit comprises a write port control circuit and a write word line decoder.

10. A semiconductor memory comprising:
    a first tier comprising a first port array portion;
    a second tier vertically stacked with respect to said first tier using at least one via, wherein said second tier comprises a second port array portion, wherein said first port array portion and said second port array portion are symmetrically disposed; and
    at least one three-dimensional, three-port bit cell comprising:
      a first portion disposed on said first port array portion, wherein said first portion comprises a plurality of write port elements, said plurality of write port elements comprising a plurality of write bit lines extending in a first direction in a first conductive layer of said first tier, at least one write word line that extends in a second direction in a second conductive layer of said first tier, and a first transistor and a first latch invertor disposed on the first port array portion, wherein the first conductive layer and the second conductive layer of the first tier are different; and
      a second portion disposed on said second port array portion, wherein said second portion comprises a plurality of read port elements, said plurality of read port elements comprising a plurality of read bit lines extending in the first direction in a first conductive layer of said second tier, at least one read word line that extends in the second direction in a second conductive layer of said second tier, and a second transistor and a second latch invertor disposed on the second port array portion, wherein the first conductive layer and the second conductive layer of the second tier are different, and wherein the first transistor and the second transistor are vertically symmetrically disposed and the first latch invertor and the second latch invertor are vertically symmetrically disposed on respective first port array portion and second port array portion, and wherein the first transistor is coupled to the second transistor by an inter-layer via.

11. The semiconductor memory of claim 10, wherein said-second direction is different from said first direction.

12. The semiconductor memory of claim 10, wherein said plurality of read port elements comprises a plurality of read port gates.

13. The three-dimensional, three-port bit cell of claim 12, wherein said second portion further comprises at least one latch invertor coupled to the plurality of read port gates.

14. The semiconductor memory of claim 10, further comprising a write port control circuit disposed on said first tier and a read port control circuit disposed on said second tier.

15. The semiconductor memory of claim 10, further comprising a write driver and a write word line decoder disposed on said first tier and a read input/output (I/O) circuit and a read word line decoder disposed on said second tier.

16. A method comprising:
    disposing a write portion of a three-dimensional, three-port bit cell onto a first tier, wherein the write portion includes a plurality of write port elements, said plurality of write port elements comprising a plurality of write bit lines extending in a first direction in a first conductive layer of said first tier, at least one write word line that extends in a second direction in a second conductive layer of said first tier, and a first transistor and a first latch invertor, wherein the first conductive layer and the second conductive layer of the first tier are different;
    disposing a read portion of the three-dimensional, three-port bit cell onto a second tier vertically stacked with respect to the first tier, wherein the read portion includes a plurality of read port elements, said plurality of read port elements comprising a plurality of read bit lines extending in the first direction in a first conductive layer of said second tier, at least one read word line that extends in the second direction in a second conductive layer of said second tier, and a second transistor and a second latch invertor, wherein the first conductive layer and the second conductive layer of the second tier are different, and wherein the first transistor and the second transistor are vertically symmetrically disposed and the first latch invertor and the second latch invertor are vertically symmetrically disposed on respective write portion and read portion; and
    coupling the first transistor to the second transistor using at least one via.

17. The method of claim 16, further comprising:
    routing a first set of signals within the first tier for the plurality of write port elements; and
    routing a second set of signals within the second tier for the plurality of read port elements.

18. The method of claim 16, further comprising:
disposing at least one latch invertor on the second tier; and
coupling the at least one latch invertor to the plurality of read port elements.

* * * * *